US010691320B2

(12) United States Patent
Dhayanithi et al.

(10) Patent No.: US 10,691,320 B2
(45) Date of Patent: Jun. 23, 2020

(54) SIMULATION OF CLOUD PLATFORM INTEGRATION TESTING IN A VISUAL INTERFACE

(71) Applicant: SAP SE, Walldorf (DE)

(72) Inventors: Vishnuprasath Dhayanithi, Bangalore (IN); Bhuvan Mehta, Bangalore (IN); Karthikeyan R, Rasipuram (IN); Mahesh Srikrishnan, Tanjore (IN)

(73) Assignee: SAP SE, Walldorf (DE)

( * ) Notice: Subject to any disclaimer, the term of this patent is extended or adjusted under 35 U.S.C. 154(b) by 229 days.

(21) Appl. No.: 15/710,843

(22) Filed: Sep. 21, 2017

(65) Prior Publication Data
US 2019/0087075 A1 Mar. 21, 2019

(51) Int. Cl.
G06F 9/44 (2018.01)
G06F 3/0484 (2013.01)
G06F 3/0481 (2013.01)
G06F 8/34 (2018.01)
G06F 11/36 (2006.01)
G06F 30/00 (2020.01)
G06F 30/20 (2020.01)

(52) U.S. Cl.
CPC ...... *G06F 3/04847* (2013.01); *G06F 3/04817* (2013.01); *G06F 3/04842* (2013.01); *G06F 8/34* (2013.01); *G06F 11/3664* (2013.01); *G06F 11/3684* (2013.01); *G06F 30/00* (2020.01); *G06F 30/20* (2020.01)

(58) Field of Classification Search
CPC .......... G06F 8/34; G06F 8/61; G06F 11/3664; G06F 11/3684; G06F 11/362
See application file for complete search history.

(56) References Cited

U.S. PATENT DOCUMENTS

| | | | |
|---|---|---|---|
| 8,694,958 B1 * | 4/2014 | Potter | G06F 11/3664 717/109 |
| 9,922,340 B1 * | 3/2018 | Vaver | G06Q 30/0242 |
| 2002/0059054 A1 * | 5/2002 | Bade | G06F 17/5022 703/20 |
| 2004/0098689 A1 * | 5/2004 | Weed | G06F 17/50 716/102 |
| 2008/0263512 A1 * | 10/2008 | Dellas | G06F 8/34 717/105 |

(Continued)

*Primary Examiner* — Duy Khuong T Nguyen
(74) *Attorney, Agent, or Firm* — Buckley, Maschoff & Talwalkar LLC

(57) ABSTRACT

An integration flow segment is identified by receiving a start point and an end point in an integration flow in a web editor in a graphical user interface. The integration testing is simulated for the integration flow segment by providing a test payload in the web editor. A code segment corresponding to the integration flow segment is extracted. Based on the code segment, a runtime artifact is generated and deployed in a worker node hosting an integration runtime engine. The runtime artifact is loaded in a volatile memory corresponding to the worker node, and executed with the test payload in a worker node. The results of simulated integration testing are sent to the web editor. The runtime artifact is unloaded from the volatile memory. Results of the simulated integration testing are displayed at a visual proximity to sequence flows in the integration flow segment in the web editor.

18 Claims, 14 Drawing Sheets

(56) References Cited

U.S. PATENT DOCUMENTS

| | | | |
|---|---|---|---|
| 2009/0300585 A1* | 12/2009 | Meenakshisundaram | ................... G06F 11/3664 717/124 |
| 2014/0244570 A1* | 8/2014 | Simitsis | ................ G06F 16/254 707/602 |
| 2014/0344817 A1* | 11/2014 | Jovanovic | ............. G06F 9/5066 718/102 |
| 2015/0205706 A1* | 7/2015 | Michelsen | ................ G06F 8/34 717/125 |
| 2016/0092059 A1* | 3/2016 | Tu | ......................... G06F 16/252 715/738 |
| 2017/0242780 A1* | 8/2017 | Arbel | ................... G06F 11/3664 |
| 2018/0060456 A1* | 3/2018 | Phatak | .................. G06F 9/5027 |
| 2018/0293158 A1* | 10/2018 | Baughman | .......... G06F 11/3692 |

\* cited by examiner

```
<bpmn2:extensionElements>
<bpmn2:collaboration id="Collaboration_1" name="Default Collaboration">
<bpmn2:process id="Process_1" isExecutable="false" name="Integration Process">
< bpmn2:extensionElements>
702 → <bpmn2:startEvent id="StartEvent 1" name="Start">
<bpmn2:endEvent id="EndEvent 3" name="END">
704 → <bpmn2:call Activity id="CallActivity 1" name="Content Modifier">
706 → <bpmn2:sequenceFlow id="SequenceFlow 2" sourceRef="StartEvent 1" targetRef="CallActivity_1"/>
<bpmn2:callActivity id="CallActivity 3" name="Script">
<bpmn2:sequenceFlow id="SequenceFlow 3" sourceRef="CallActivity_1" targetRef="ExclusiveGateway_1"/>

<bpmn2:exclusiveGateway default="Defaultseq1499158822421" id="ExclusiveGateway 1" name="Router">
<bpmn2:endEvent id="TerminateEvent 1499158822421" name="">
<bpmn2:callActivity id="CallActivity 5" name="Content Modifier">
<bpmn2:callActivity id="CallActivity 6" name="Message Mapping">
<bpmn2:sequenceFlow id="sequence1499158822418" sourceRef="StartEvent 2" targetRef="CallActivity_1"/>
708 → <bpmn2:sequenceFlow id="sequence1499158822419" sourceRef=" CallActivity_1" targetRef="ExclusiveGateway"/>
<bpmn2:sequenceFlow id="Defaultseq1499158822421" sourceRef=" ExclusiveGateway_1" targetRef="TerminateEvent"/>
<bpmn2:sequenceFlow id="SequenceFlow 1" name=" " sourceRef=" ExclusiveGateway_1" targetRef="CallActivity_2"/>
<bpmn2:sequenceFlow 1499158822423" sourceRef="CallActivity_3" targetRef="CallActivity_5"/>
<bpmn2:sequenceFlow 1499158822424" sourceRef="CallActivity_5" targetRef="CallActivity_6"/>
<bpmn2:sequenceFlow id="TerminateStepSequence" sourceRef="CallActivity_6" targetRef="EndEvent_3"/>
...</bpmn2:process>
<bpmn2:BPMNDiagram id="BPMNDiagram_1" name="Default Collaboration Diagram>
</bpmn2:definitions>
```

```
<?XML version="1.0" encoding="UTF-8"?><bpmn2:definitions xmlns:bpmn2="http://www.omg.org/spec/BPMN/20100524/MODEL"
<bpmn2:collaboration id="Collaboration_1" name="Default Collaboration">
<bpmn2:process id="Process_2" name="Local Integration Process">
<bpmn2:extensionElements>
<bpmn2:endEvent id="EndEvent_3" name="END"/>
<bpmn2:startEvent id="StartEvent_2" name="Start"/>
<bpmn2:call Activity id="CallActivity_1" name="Content Modifier"/>
<bpmn2:exclusiveGateway default="Defaultseq1499158822421" id="ExclusiveGateway_1" name="Router">
<bpmn2:endEvent id="TerminateEvent_1499158822421" name=""/>
<bpmn2:callActivity id="CallActivity_3" name="Script"/>
<bpmn2:callActivity id="CallActivity_5" name="Content Modifier">
<bpmn2:callActivity id="CallActivity_6" name="Message Mapping">
<bpmn2:sequenceFlow id="sequence1499158822418" sourceRef="StartEvent_2" targetRef="CallActivity_1"/>
<bpmn2:sequenceFlow id="sequence1499158822419" sourceRef="CallActivity_1" targetRef="ExclusiveGateway_1"/>
<bpmn2:sequenceFlow id="Defaultseq1499158822421" sourceRef="ExclusiveGateway_1" targetRef="TerminateEvent"/>
<bpmn2:sequenceFlow id="SequenceFlow_1" name=" " sourceRef="ExclusiveGateway_1" targetRef="CallActivity_2"/>
<bpmn2:sequenceFlow id="SequenceFlow 1499158822423" sourceRef="CallActivity_3" targetRef="CallActivity_5"/>
<bpmn2:sequenceFlow id="SequenceFlow 1499158822424" sourceRef="CallActivity_5" targetRef="CallActivity_6"/>
<bpmn2:sequenceFlow id="TerminateStepSequence" sourceRef="CallActivity_6" targetRef="EndEvent_3"/>
```

FIG. 7B

SIMULATION OF CLOUD PLATFORM INTEGRATION TESTING IN A VISUAL INTERFACE

FIELD

Illustrated embodiments generally relate to data processing, and more particularly cloud platform integration testing in a graphical user interface.

BACKGROUND

In an enterprise, a collection of technologies and services forms a middleware framework to enable integration of systems and applications across the enterprise. Integration testing requires information about the end systems such as a source system and a destination system, and list of steps to perform the integration testing. Typically, to perform an integration testing, the source system and the destination system are required to be working or in live mode. When an issue or problem is reported in the integrated systems, it is challenging to replicate the issue by setting up and configuring the source system and the destination system as they were in the live production landscape when the issue occurred. In some scenarios, time taken to replicate the issue may span for a few days. Therefore, it is challenging to perform integration testing quickly and efficiently.

BRIEF DESCRIPTION OF THE DRAWINGS

The claims set forth the embodiments with particularity. The embodiments are illustrated by way of examples and not by way of limitation in the figures of the accompanying drawings in which like references indicate similar elements. Various embodiments, together with their advantages, may be best understood from the following detailed description taken in conjunction with the accompanying drawings.

FIG. 2 is a block diagram illustrating user interface of a web editor, according to one embodiment.

FIG. 7A shows a code snippet of integration flow in a project, according to one embodiment.

FIG. 7B shows a segment of code snippet corresponding to extracted integration flow in a project, according to one embodiment.

DETAILED DESCRIPTION

Embodiments of techniques of cloud platform integration testing in a graphical user interface are described herein. In the following description, numerous specific details are set forth to provide a thorough understanding of the embodiments. A person of ordinary skill in the relevant art will recognize, however, that the embodiments can be practiced without one or more of the specific details, or with other methods, components, materials, etc. In some instances, well-known structures, materials, or operations are not shown or described in detail.

Reference throughout this specification to "one embodiment", "this embodiment" and similar phrases, means that a particular feature, structure, or characteristic described in connection with the embodiment is included in at least one of the one or more embodiments. Thus, the appearances of these phrases in various places throughout this specification are not necessarily all referring to the same embodiment. Furthermore, the particular features, structures, or characteristics may be combined in any suitable manner in one or more embodiments.

Figure 1:
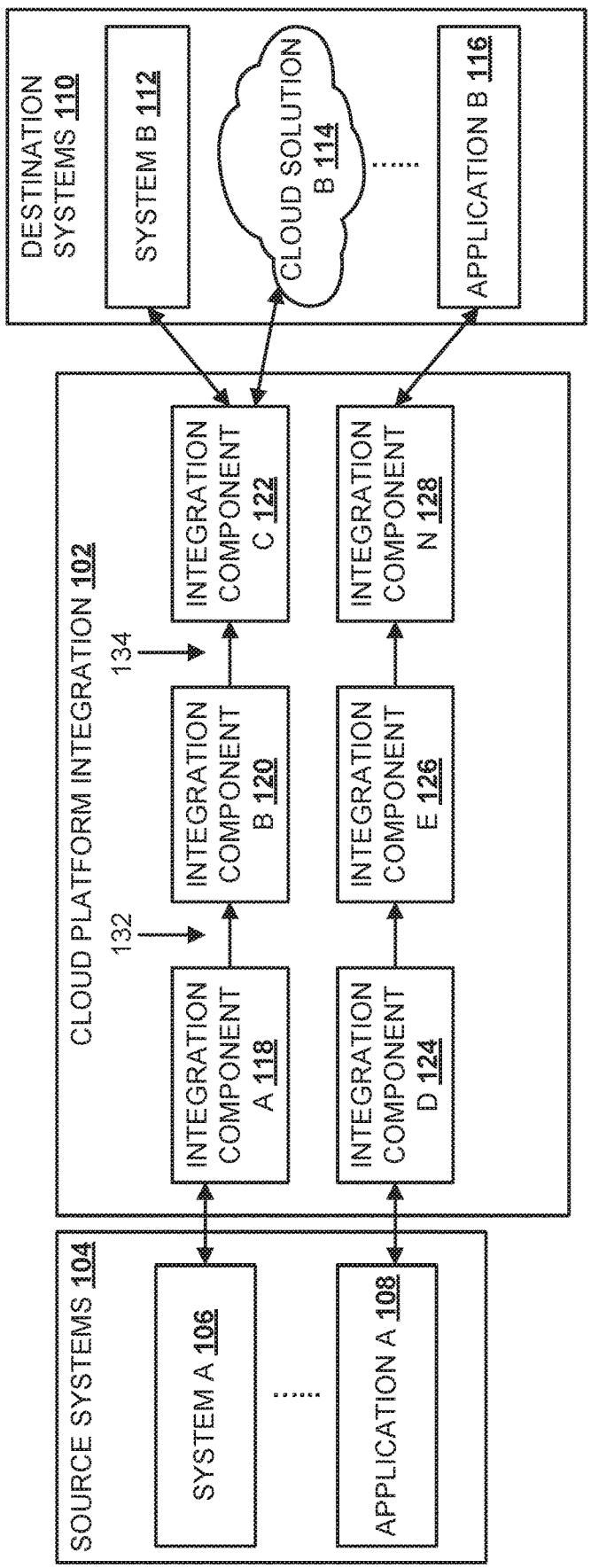
FIG. 1 is a block diagram illustrating architecture of cloud platform integration testing environment, according to one embodiment.

FIG. 1 is a block diagram illustrating architecture of cloud platform integration testing environment, according to one embodiment. Cloud platform integration supports end-to-end integration process across cloud-based and on-premise applications. Cloud platform integration seamlessly integrates heterogeneous applications and systems. Cloud platform integration 102 integrates source systems 104 such as system A 106, application A 108, etc., with destination systems 110 such as system B 112, cloud solution B 114, application B 116, etc. The cloud platform integration 102 between the source systems 104 and the destination systems 110 is also referred to as middleware 130. For example, system A 106 may be an on-premise system, application A 108 may be an enterprise resource planning (ERP) system or cloud solution, system B 112 may be a customer relationship management (CRM) system, cloud solution B 114 may be an enterprise cloud solution, application B 116 may be an enterprise application, etc. The source systems and the destination systems may be a combination of specialized/proprietary hardware and proprietary software with custom processing speed and memory.

An integration process between the source systems 104 and the destination systems 110 is stored in an artifact named integration flow. The integration flow defines how a message is processed between the source systems 104 and the destination systems 110. Integration flows are used to specify integration patterns referred to as mapping or routing between source systems and destination systems. The integration flow between the source systems 104 and the destination systems 110 is stored in a file format such as extensible markup language (XML). Cloud platform integration includes various integration components. Various integration components such as integration component A 118, integration component B 120, integration component C 122, integration component D 124, integration component E 126, and integration component N 128 are available in the cloud platform integration 102 in middleware. An individual integration component may perform a specific function and, in some cases, may invoke additional scripts or program logic to perform the specific function. In some scenarios, there may be multiple integration components in the cloud platform integration 102.

Integration testing is performed in the cloud platform integration 102 using a visual interface. A web integration development environment (IDE) or web editor application displayed in a graphical user interface provides a visual interface. The web integration development environment (IDE) or web editor is an integrated development tool that enables building, debugging, testing, deploying, etc., applications. Web editor enables modeling and testing integration flows, configure attributes for the integration flows and deploy them for execution. The message flow in the sequence of integration components may be displayed in the web editor. For example, the integration flow from the system A 106 to the integration components such as integration component A 118, integration component B 120, integration component C 122 and the system B 112 is displayed in the web editor. The flow from the integration component A 118 to the integration component B 120 is sequential, and the connectivity between the integration component A 118 and the integration component B 120 is referred to as sequence flow 132. Similarly, the flow from the integration component B 120 to the integration component C 122 is sequential referred to as sequence flow 134. Similarly, an individual sequence flow connects individual integration components.

Figure 2:
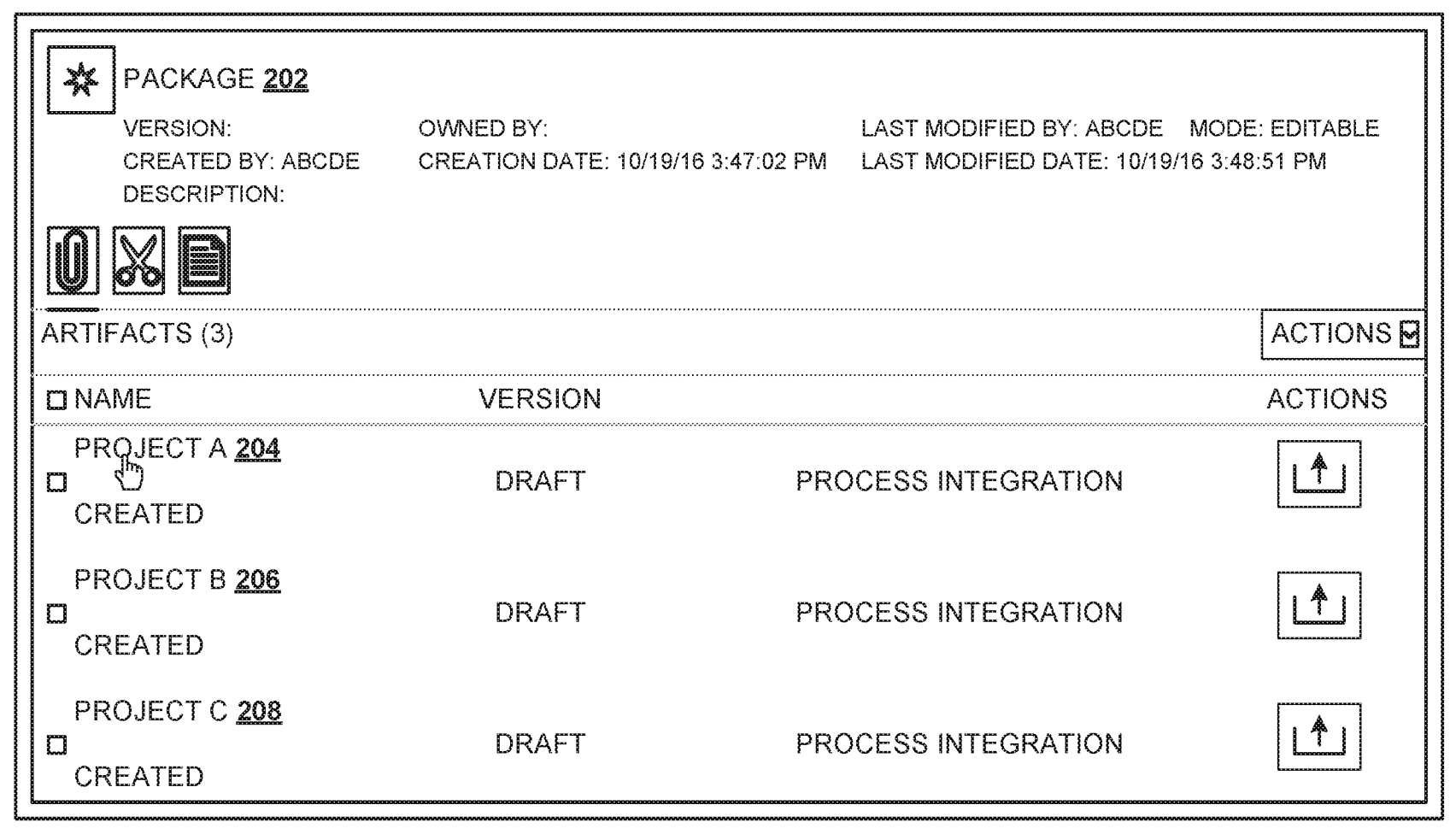

FIG. 2 is a block diagram illustrating user interface of a web editor, according to one embodiment. Web editor 200 shows package 202 with various projects such as project A 204, project B 206, project C 208, etc. The individual projects represent a use case for which integration flows between the source systems, integration components and the destination systems are modeled. When an individual project is selected project A 204 as shown in FIG. 2, the integration flow is displayed in the web editor 300 as shown in FIG. 3.

Figure 3:
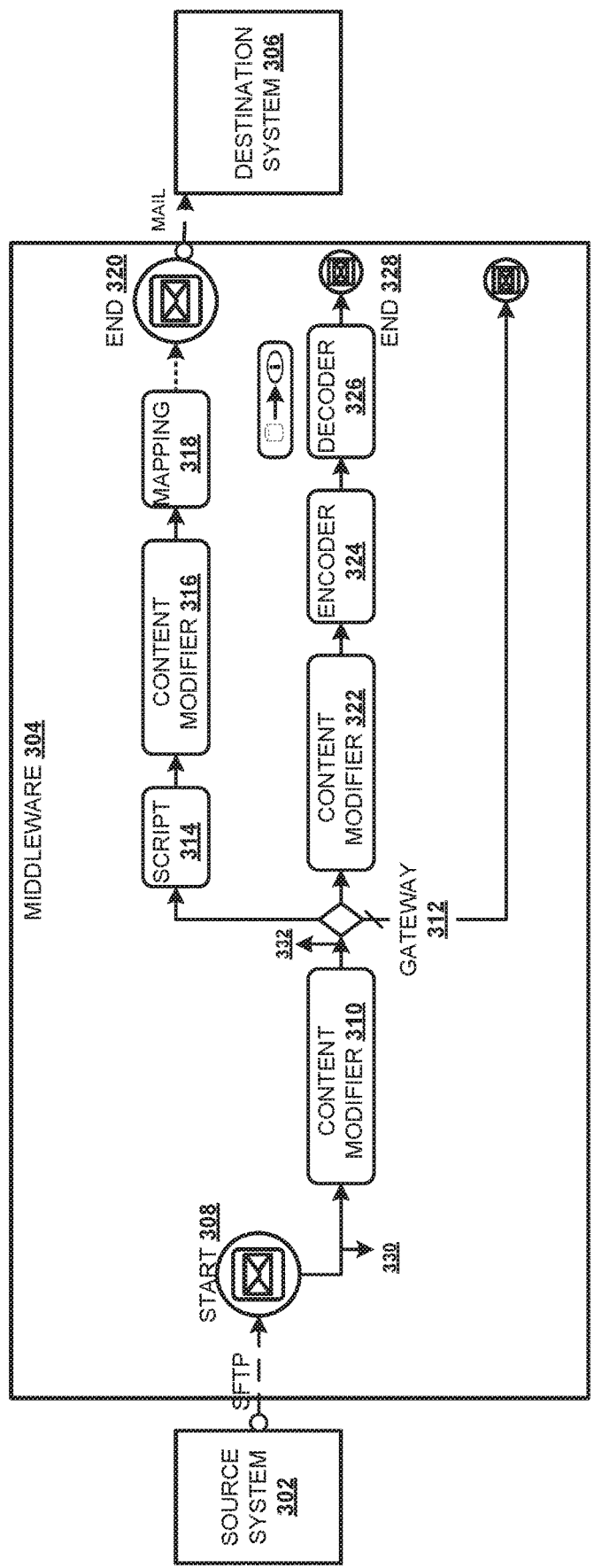
FIG. 3 is a block diagram illustrating a graphical user interface of an integration flow in a web editor, according to one embodiment.

FIG. 3 is a block diagram illustrating a graphical user interface of an integration flow in a web editor, according to one embodiment. Integration flow is graphically represented showing source system 302, middleware 304 and destination system 306. Various integration components include start 308, content modifier 310, gateway 312, script 314, content modifier 316, mapping 318, end 320, content modifier 322, encoder 324, decoder 326, and end 328. Sequence flow 330 connects the start 308 with the content modifier 310, sequence flow 332 connects the content modifier 310 with the gateway 312. Similarly, sequence flows connect various integration components in a sequence. When a message is received from the source system 302, the message passes through various integration components to the destination system 306. The sequence in which the message passes from the source system 302 to the destination system 306 is depicted in the integration flow. For example, integration content/message may be delivered from the source system 302 such as an online shopping portal to the destination system 306 such as an enterprise warehouse application.

For a particular use case or scenario, the integration flow depicts the content/message transfer from source system 302 through the integration components in a sequence/logical flow to the destination system 306. The use case may vary depending on requirements from customers. Depending on the use case, various functions may be associated with the integration components. For example, the integration component content modifier 310 may have functions provided in the web editor or may be an external function invoked from the web editor. With the provided input, the function performs specific logic and provides the output. Similarly, the integration component mapping 318 may map or convert the input, for example, currency from one format to another format. The currency conversion function may be an external application invoked from the web editor. The use case may also follow more than one sequence depending on the functionality of the use case. For example, based on the logic/criteria associated with the gateway 312, the message may flow from gateway 312 to script 314, or gateway 312 to content modifier 322. Message flow from integration component script 314 to end 320 may form a particular sequence, and message flow from the content modifier 322 to end 328 may form a difference sequence depending on the criteria associated with the gateway.

Visual representation of integration components 304 in the web editor enables users to visually test the message flow from the source system 302 to the destination system 306. The message flow from the source system 302 to the destination system 306 may depict the complete integration flow. User may choose to test the complete integration flow. However, there is also a possibility to test a section or segment of the integration flow such as a segment from the integration component script 314 to mapping 318. An identified segment of integration flow is referred to as integration flow segment. Various integration flow segments may be visually tested in the web editor.

Figure 4A:
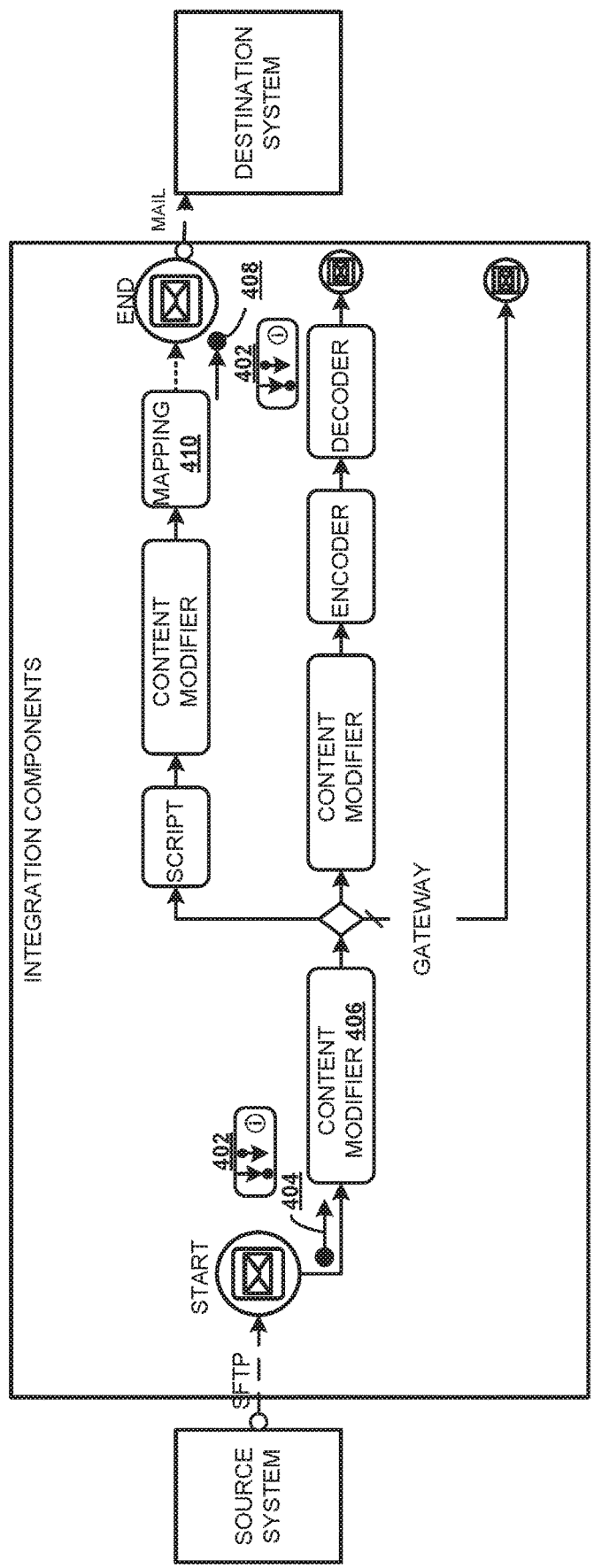
FIG. 4A illustrates identifying start and end point in an integration flow, according to one embodiment.
Figure 4B:
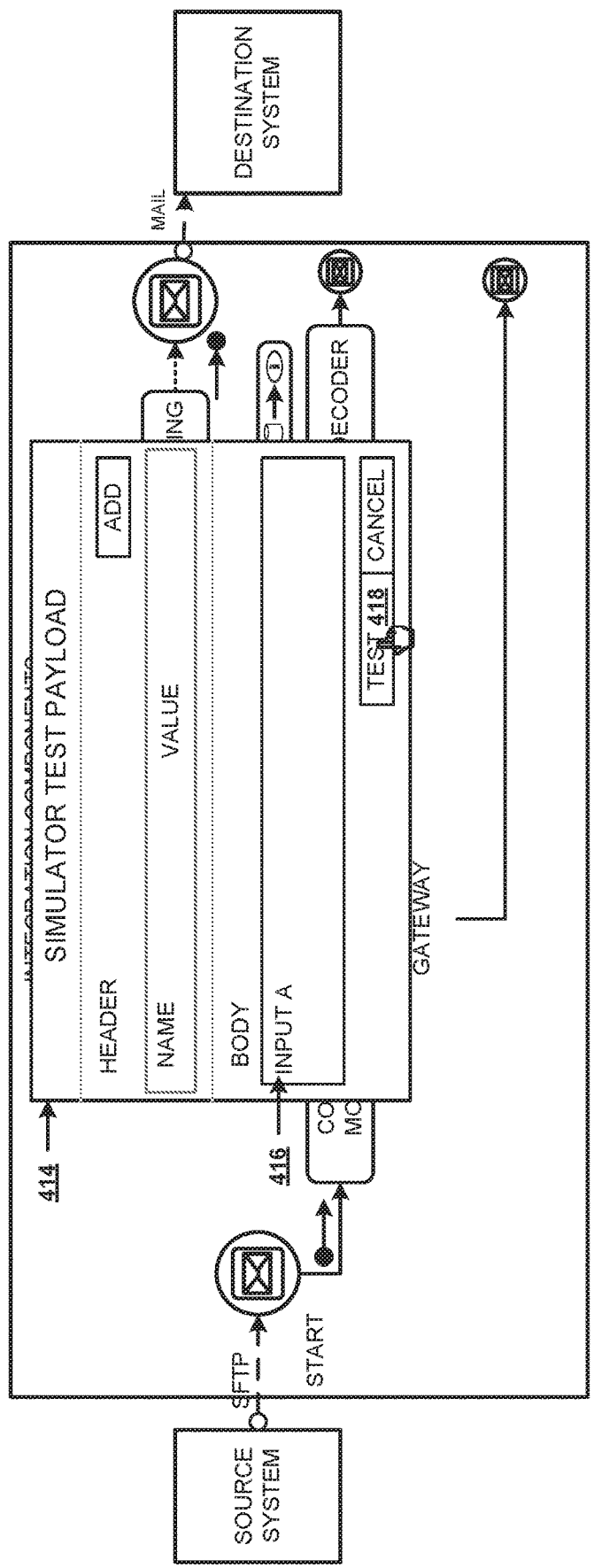
FIG. 4B illustrates simulating an integration flow segment, according to one embodiment.
Figure 4C:
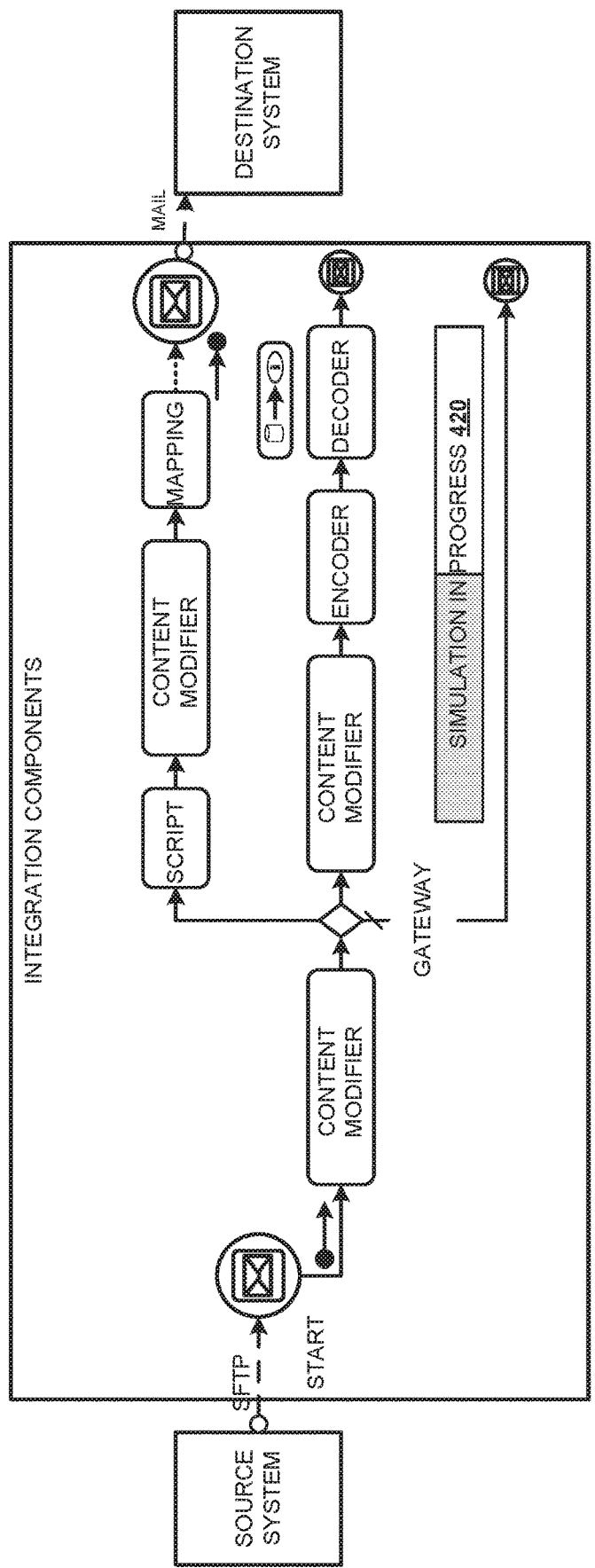
FIG. 4C illustrates simulating an integration flow segment, according to one embodiment.

FIGS. 4A, 4B and 4C in combination illustrate simulation of integration flow, according to one embodiment. FIG. 4A illustrates identifying start and end point in an integration flow, according to one embodiment. The integration flow is displayed in a web editor in a graphical user interface. When a user wishes to perform integration testing on an integration flow, a start point is identified, and a start point icon is placed before an integration component from where the integration testing should start. The start point icon may be placed at a visual proximity to the integration component. For example, start point icon from popup window 402 is selected and placed as start point 404 at a visual proximity before the integration component content modifier 406. Similarly, the end point icon from the popup window 402 is selected and placed as the end point 408 at a visual proximity after the integration component mapping 410. The segment of integration flow identified between the start point 404 to the end point 408 is referred to as integration flow segment. The simulated integration testing is performed on the identified integration flow segment as explained in FIG. 4B and FIG. 4C.

FIG. 4B illustrates simulating an integration flow segment, according to one embodiment. To test an integration flow segment identified from the start point 404 to the end point 408, a simulated integration testing is performed on the integration flow segment. When a simulate button is clicked (not shown), popup window 414 is displayed to receive a test payload as input for the simulated integration testing. With the input provided, the integration flow segment may be tested. For example, in the popup window 414, the test payload 'input A' 416 may be provided, and test button 418 is clicked. After clicking the test button 418, simulated integration testing of the integration flow segment is explained in FIG. 4C.

FIG. 4C illustrates simulating an integration flow segment, according to one embodiment. In response to clicking the test button 418 in FIG. 4B, simulation of the integration flow is performed as shown in FIG. 4C. The simulation of integration flow may be visually represented as simulation in progress 420. On completion of simulation, the results of simulation may be displayed in a web editor as shown in FIG. 5A.

Figure 5A:
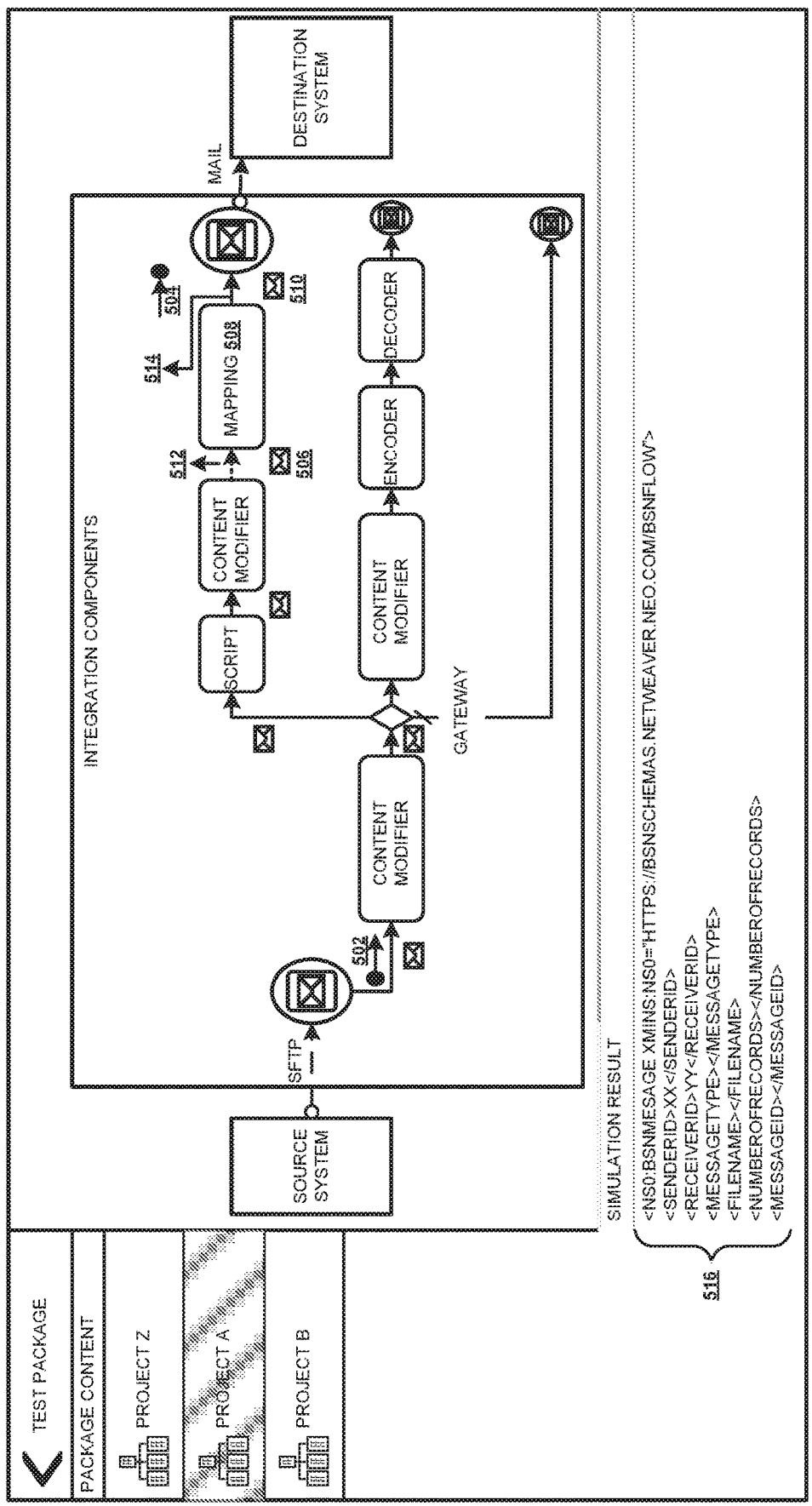
FIG. 5A shows result of execution of integration flow, according to one embodiment.
Figure 5B:
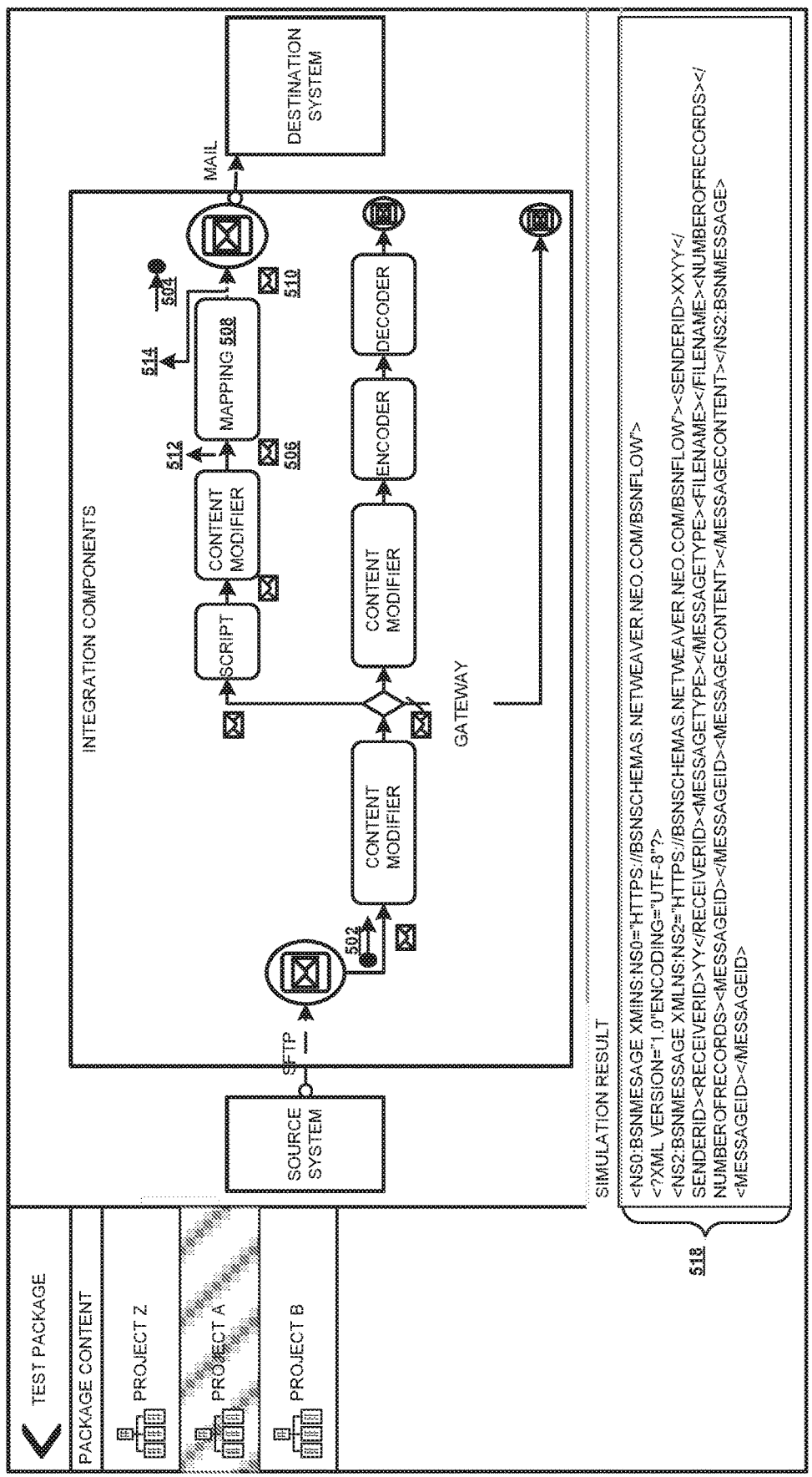
FIG. 5B shows result of execution of integration flow, according to one embodiment.

FIG. 5A shows result of execution of integration flow, according to one embodiment. Based on simulation of integration testing in an integration flow segment as explained in FIG. 4A to FIG. 4C, the result of simulation is shown in FIG. 5A and FIG. 5B in a web editor. A visual representation such as an envelope icon holding messages may be displayed corresponding to individual sequence flow between integration components. For example, in the integration flow segment identified between the start point 502 to the end point 504, envelope icon 506 is displayed corresponding to sequence flow 512, and envelope icon 510 is displayed corresponding to sequence flow 514. The visual display of envelope icon indicates that the result of integration testing is available in the web editor. When the sequence flow 512 is selected, the input message 516 to the integration component mapping 508 may be displayed in the web editor. Envelope icon 506 and the envelope icon 510 merely indicate that the simulation of integration testing was performed successfully and the results are available.

For example, when the sequence flow 512 is clicked, input provided to the integration component mapping 508 is shown in code segment 516. When the sequence flow 514 is clicked, output provided from mapping 508 is shown in code segment 518 in FIG. 5B. FIG. 5B shows result of execution of integration flow, according to one embodiment. By analyzing the code segment 516, user may validate the input provided to the mapping 508. Similarly, by analyzing the code segment 518 in FIG. 5B, user may validate the output from the mapping 508. By analyzing the code segment 516 and code segment 518, it can be determined if the integration component is functioning as expected or is there an error to be considered and fixed.

For example, as shown in the code segment 516, senderId 'XX' and receiverId 'YY' is mapped in the mapping 508, and the output 'XXYY' is shown in code segment 518. Similar, analysis may be performed on the individual sequence flows from the start point 502 to the end point 504, to test whether the individual integration components within the start point 502 and the end point 504 is functioning as expected or not. Since the input and output are visually simulated in real time, it is simple and easy for user to view the input and output at individual sequence flow, and analyze. Thus user is able to simulate and perform integration testing on various segments of the integration flow, and the complete integration flow as well. Thus result of integration testing is displayed in a graphical user interface such as web editor as explained above.

Figure 6:
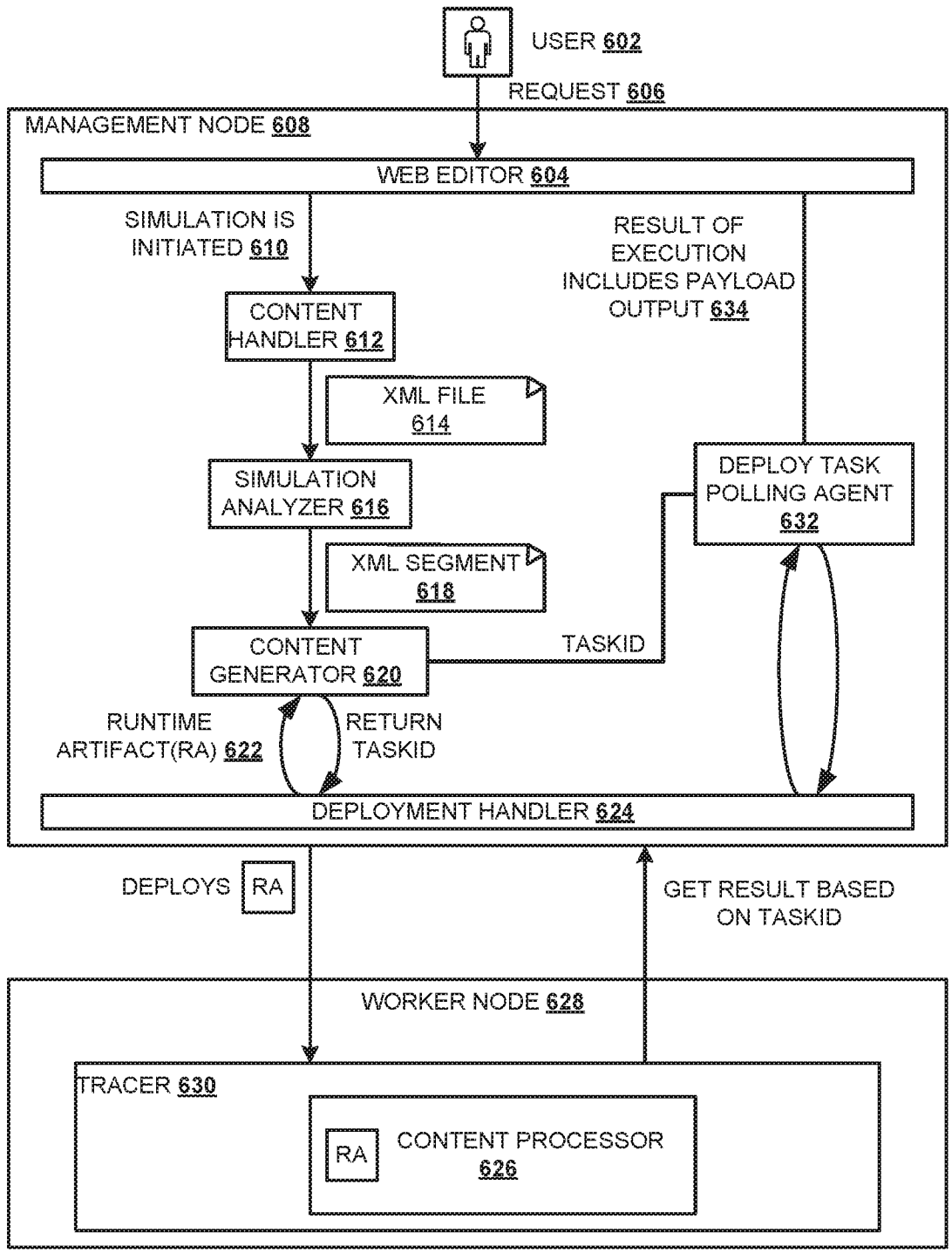
FIG. 6 shows architecture of cloud platform integration testing in a graphical user interface, according to one embodiment.

FIG. 6 shows architecture 600 of cloud platform integration testing in a graphical user interface, according to one embodiment. Cloud integration refers to integration nodes that execute on the cloud platform, where an individual integration node is a virtual machine instance. These integration nodes may be management nodes or worker nodes. Management nodes supervise the functioning of the worker nodes by ensuring that the worker nodes are up and running. Management node stores integration deployment artifacts such as integration flows. The worker node hosts' integration runtime engine and is responsible for message processing in the integration flows. User 602 may select a project including an integration flow corresponding to a use case. User 602 interacts with web editor 604 to simulate the integration flow displayed in the web editor 604.

In the web editor 604, the user may select and drop start point icon and end point icon to select a segment of integration flow for simulation and testing. Based on the start point and end point placed in the segment of integration flow, and by providing input payload/test payload, a request 606 to simulate the segment of integration flow is received at the web editor 604 in the management node 608. In response to the request 606, simulation is initiated 610 at the content handler 612. The content handler 612 is an interface responsible for handling content in a user's context. The content handler 612 receives the request to perform simulation along with information such as the start point, the end point and the input payload.

The content handler 612 identifies the selected project and provides code snippet such as an extensible markup language (XML) file 614 of the selected project to simulation analyzer 616. For example, the complete XML file of the project as explained in FIG. 7A below is provided to the simulation analyzer 616. The simulation analyzer 616, traverses through the complete XML file of the project, and extracts a code segment such as a segment of XML file between the start point and end point specified in the web editor. The simulation analyzer 616, extracts XML segment 618, and provides to content generator 620. The content generator 620 generates runtime artifact 622 based on the received XML segment 618. Deployment handler 624 deploys the runtime artifact 622 on content processor 626 in worker node 628. After execution of integration testing, the content processor 626 is based on tracer 630 which records/logs payload information at the different steps in the integration flow segment. With the input payload, the content processor 626 executes the runtime artifact. Deploy task polling agent 632 polls result of execution of the runtime artifact and provides the result of execution to the web editor 604. The result of execution includes payload output 634 at the different steps in the integration flow segment. The result of simulated execution integration testing is sent to the web editor 604. The web editor 604 displays the payload output corresponding to the individual steps in the integration flow segment.

FIG. 7A shows a code snippet of integration flow in a project, in an embodiment. The code snippet may be XML file 700A corresponding to the selected project as shown in FIG. 7A. The complete integration flow is represented in the XML file. The XML file includes identifiers and names of individual integration components along with their sequence. For example, start 308 in FIG. 3 is represented in line 702 in XML 700A with identifier 'startevent 1' and name 'start'. The next integration component content modifier 310 in FIG. 3 next to start 308, is represented in line 704 in XML file 700 with identifier 'callactivity 1' and name 'content modifier'. The sequence flow 330 in FIG. 3 connecting start event 308 with content modifier 310, is represented in line 706 in XML 700 with sequence flow identifier 'sequenceflow 2', source ref 'startevent 1' and targetref 'callactivity 1'. The line 706 indicates that sequenceflow 2 connects start 308 in FIG. 3 and content modifier 310. Similarly, the XML file 700A represents the complete list of integration components along with the sequence in which they are connected with each other. Using the XML file 700A, the integration flow can be reproduced in the same sequence and position in the web editor as shown in FIG. 3. The lines 708 in the XML file 700A show the functioning of the gateway.

FIG. 7B shows a segment of code snippet corresponding to extracted integration flow in a project, in an embodiment. As explained in FIG. 4A, a segment of integration flow was identified between a start point and an end point. 700B represents a code segment such as a XML segment corresponding to the segment of integration flow identified between the start point and the end point. For example, since the segment of integration flow is identified between content modifier 406 and mapping 410 in FIG. 4A, the corresponding XML segment is extracted from the complete XML file 700A, and is shown in 700B. Rest of integration flow other than the selected XML segment are not considered in the XML segment 700B. Extracted XML segment 700B is a lightweight code segment in comparison to the complete XML file 700A.

Figure 8:
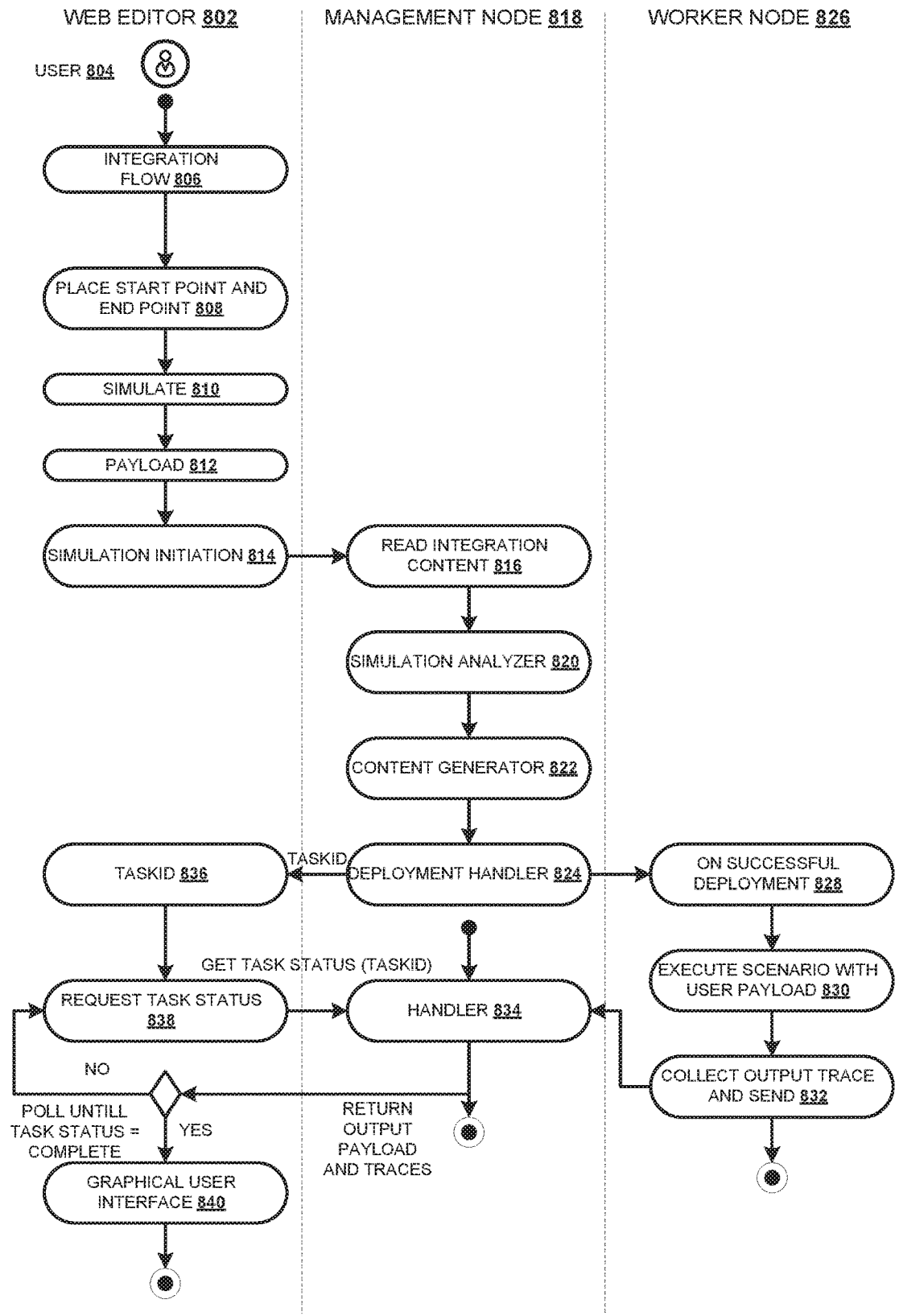
FIG. 8 is sequence diagram illustrating cloud platform integration testing in a graphical user interface, according to one embodiment.

FIG. 8 is a sequence diagram illustrating cloud platform integration testing in a graphical user interface, according to one embodiment. In the graphical user interface in web editor 802, an integration flow corresponding to a use case is displayed. The use case corresponds to the integration flow in a project. User 804 may provide input in the integration flow 806 in the web editor 802. Input may be in the form of identifying a start point and end point in the integration flow, and as show in 808 correspondingly placing the start point icon and end point icon in the integration flow. After placing the start point icon and end point icon in the integration flow, a segment of integration flow between the start point icon and the end point icon is identified as an integration flow segment. An input in the form of click/selection to simulate 810 the segment of integration flow is initiated. Payload/test payload 812 is provided as test input to the initiated simulation of the integration flow segment. After receiving payload 812, simulation is initiated 814 in the web editor 802.

The complete integration flow is represented in a code snippet such as a XML file. The XML file includes identifiers and names of individual integration components along with the sequence of connection among them. The XML file referred to as integration content is read 816 by content handler in management node 818, and provided to a simulation analyzer 820. The simulation analyzer 820 extracts a XML segment corresponding to a portion of integration flow identified between the placed start point and the end point. Content generator 822 generates a runtime artifact based on the XML segment. Deployment handler 824 deploys the generated runtime artifact in worker node 826. On successful deployment 828 of the runtime artifact in the worker node 826, execution of the runtime artifact is initiated. Execution of the runtime artifact implies execution of the use case with the provided payload 830 since the use case corresponds to the integration flow in the project. At 832, the generated output or result of simulated integration testing is collected and sent to handler 834 in the management node 818. Handler 834 is responsible for monitoring the result of deployment of the runtime artifact. Individual deployment runtime artifacts are associated with a task identifier or taskId 836 to track them. Status of deployment of task ID is requested 838 from the handler 834 on a periodic basis, and the results of the simulated integration testing are displayed in the integration flow in the graphical user interface 840 in the web editor 802. Polling the task status continues until the task status is complete. If polling the task status is complete, the results of the simulated integration testing are displayed in the integration flow in the graphical user interface 840.

Examples illustrated above with respect to FIG. 1 to FIG. 8 explain simulation of cloud platform integration testing in a visual interface. Simulation of cloud platform integration testing provides user with a simulated environment to simulate the issue or error with ease in a visual interface without having to actually replicate these source and destination systems with live hardware systems. For example, in an exemplary scenario, an enterprise resource planning (ERP) system referred to as a source system may be integrated with a destination system such as a banking system for monthly salary disbursement for employees. The integration of ERP system to the banking system may be through various integration components such as national electronic funds transfer (NEFT), etc. It is not practically possible to test this integration scenario by transferring test salary to employees by integrating the live ERP system and the banking system. In some cases the ERP system and the banking system may be a combination of specialized hardware and software systems with specialized processors. Simulation of cloud platform integration testing enables simulating and testing the monthly salary disbursement for employees without live/production systems. It is also possible to test a segment in the integration between the ERP system and the banking system, such as NEFT. Simulation of cloud platform integration testing may be performed in milliseconds or microseconds in comparison to manually trying to test the integration components that may take a few days/hours, or trying to configure a replica of live systems for a few days/hours and test. During the development cycle, using simulation of cloud platform integration testing increases developer efficiency and decreases the development time significantly. Simulation of cloud platform integration testing in a visual interface is quick and efficient, since user is able to visually analyze the test results and identify the issues/problems instantaneously, and act on them.

Figure 9:
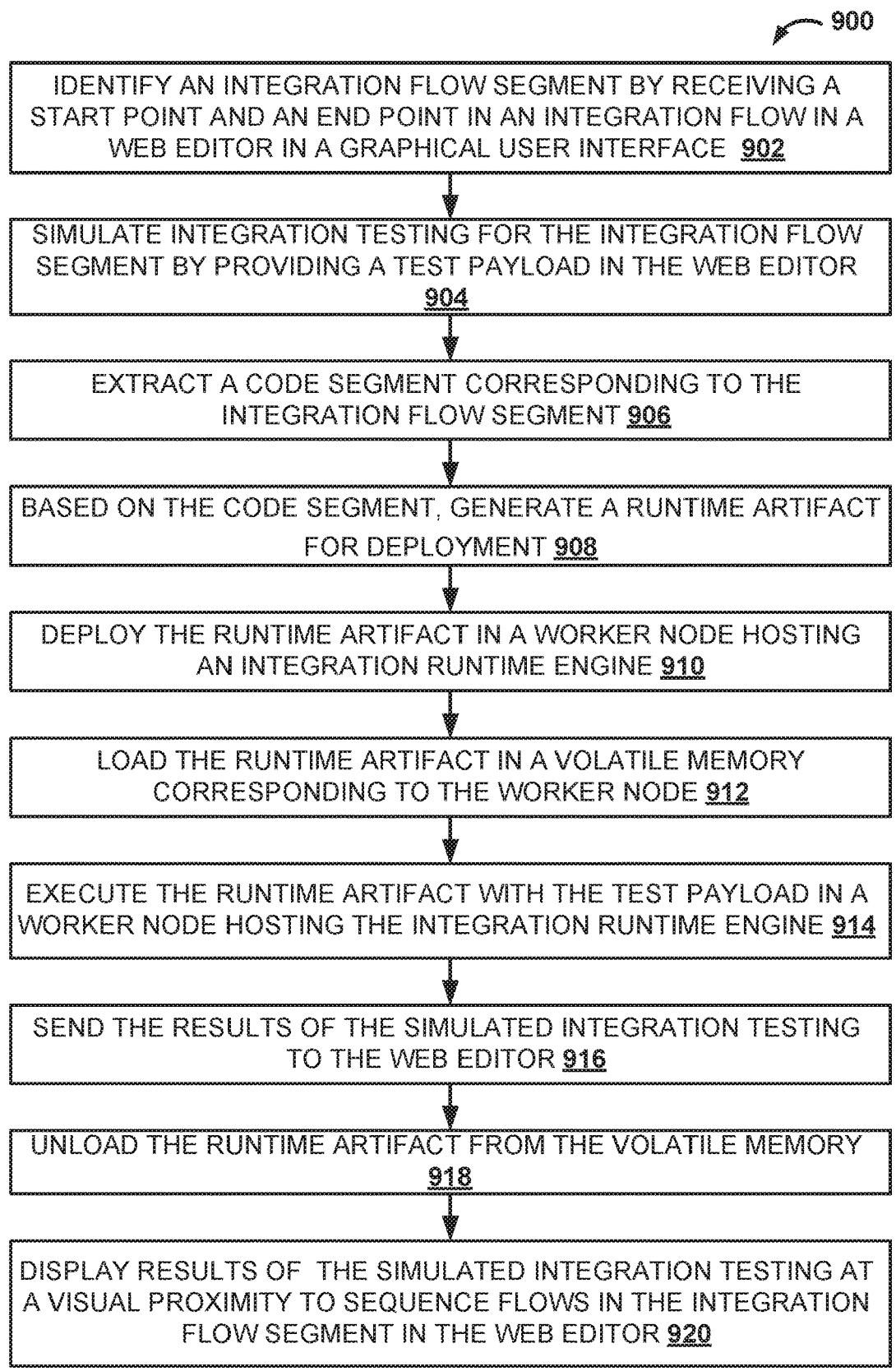
FIG. 9 is a flow chart illustrating process of cloud platform integration testing in a graphical user interface, according to one embodiment.

FIG. 9 is flow chart illustrating process 900 of cloud platform integration testing in a graphical user interface, according to one embodiment. At 902, an integration flow segment is identified by receiving a start point and an end point in an integration flow in a web editor in a graphical user interface. For example, as shown in FIG. 4A, receiving the start point 404 and the end point 410 identifies the integration flow segment. At 904, the integration testing is simulated for the integration flow segment by providing a test payload in the web editor. For example, as shown in FIG. 4B, providing the test payload as input in a popup window 414 simulates the integration flow segment. At 906, a code segment corresponding to the integration flow segment is extracted. For example, a segment of code snippet 700B shown in FIG. 7B is the code segment corresponding to the integration flow segment. At 908, based on the code segment, a runtime artifact is generated for deployment. For example, as explained in FIG. 6, content generator 616 generates a runtime artifact based on a received XML segment. At 910, the runtime artifact is deployed in a worker node hosting an integration runtime engine. For example, as explained in FIG. 6, deployment handler 618 deploys the runtime artifact in content processor 620 in worker node 622. At 912, the runtime artifact is loaded in a volatile memory corresponding to the worker node. At 914, the runtime artifact with the test payload is executed in a worker node. The worker node hosts the integration runtime engine. For example, as explained in FIG. 6, with the test payload as input, content processor 620 executes the runtime artifact. At 916, the results of simulated integration testing are sent to the web editor. For example, as explained in FIG. 6, result of execution includes payload output 626 at the different steps in the integration flow segment. The result of simulated execution integration testing is sent to the web editor 604. At 918, the runtime artifact is unloaded from the volatile memory. At 920, results of the simulated integration testing are displayed at a visual proximity to sequence flows in the integration flow segment in the web editor. For example, as explained in FIG. 6, the web editor 604 displays the payload output corresponding to the individual steps in the integration flow segment.

Some embodiments may include the above-described methods being written as one or more software components. These components, and the functionality associated with each, may be used by client, server, distributed, or peer computer systems. These components may be written in a computer language corresponding to one or more programming languages such as functional, declarative, procedural, object-oriented, lower level languages and the like. They may be linked to other components via various application programming interfaces and then compiled into one complete application for a server or a client. Alternatively, the components maybe implemented in server and client applications. Further, these components may be linked together via various distributed programming protocols. Some example embodiments may include remote procedure calls being used to implement one or more of these components across a distributed programming environment. For example, a logic level may reside on a first computer system that is remotely located from a second computer system containing an interface level (e.g., a graphical user interface). These first and second computer systems can be configured in a server-client, peer-to-peer, or some other configuration. The clients can vary in complexity from mobile and handheld devices, to thin clients and on to thick clients or even other servers.

The above-illustrated software components are tangibly stored on a computer readable storage medium as instructions. The term "computer readable storage medium" should be taken to include a single medium or multiple media that stores one or more sets of instructions. The term "computer readable storage medium" should be taken to include any physical article that is capable of undergoing a set of physical changes to physically store, encode, or otherwise carry a set of instructions for execution by a computer system which causes the computer system to perform any of the methods or process steps described, represented, or illustrated herein. Examples of computer readable storage media include, but are not limited to: magnetic media, such as hard disks, floppy disks, and magnetic tape; optical media such as CD-ROMs, DVDs and holographic devices; magneto-optical media; and hardware devices that are specially configured to store and execute, such as application-specific integrated circuits (ASICs), programmable logic devices (PLDs) and ROM and RAM devices. Examples of computer readable instructions include machine code, such as produced by a compiler, and files containing higher-level code that are executed by a computer using an interpreter. For example, an embodiment may be implemented using Java, C++, or other object-oriented programming language and development tools. Another embodiment may be implemented in hard-wired circuitry in place of, or in combination with machine readable software instructions.

Figure 10:
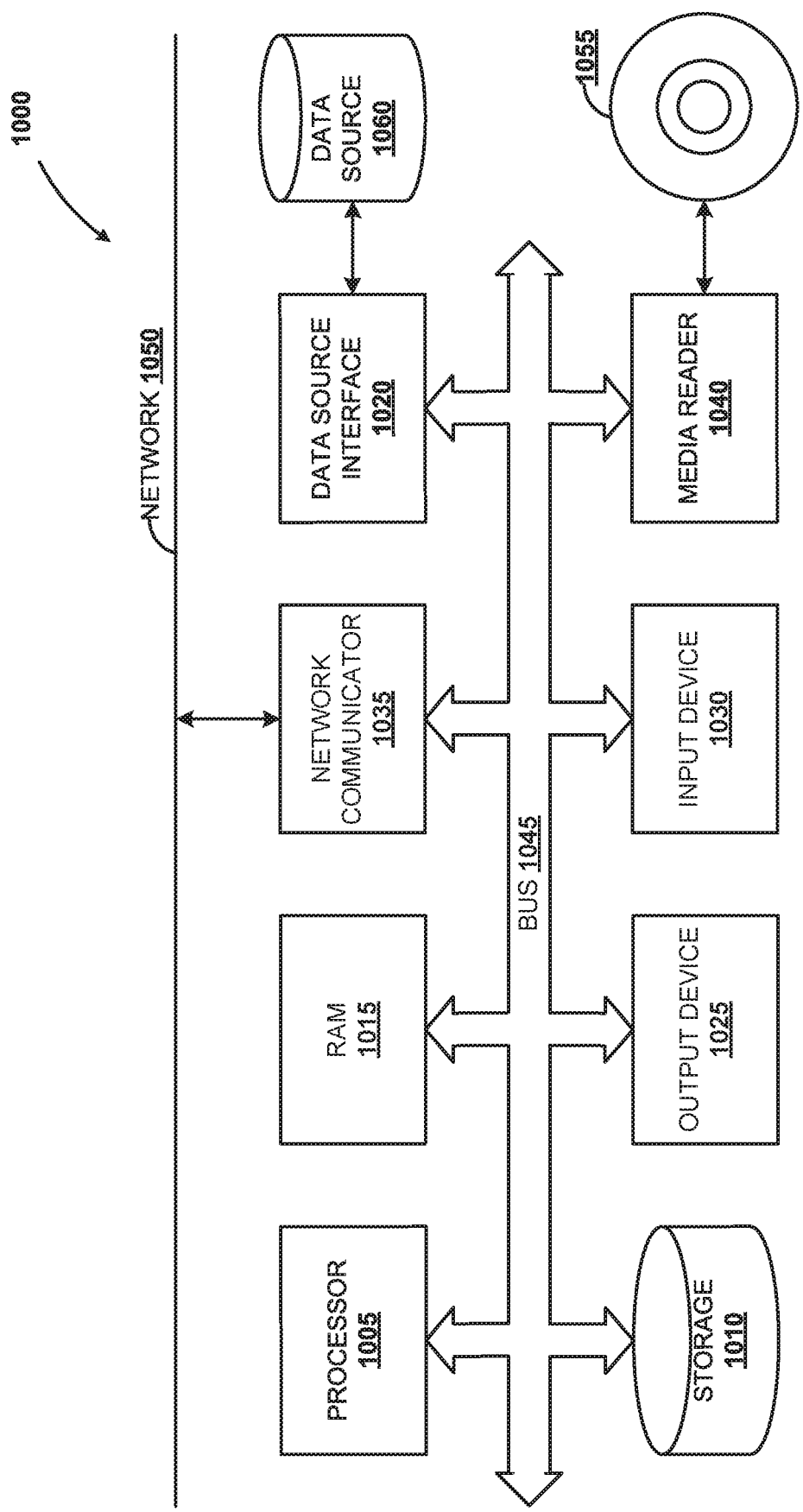
FIG. 10 is a block diagram of an exemplary computer system, according to one embodiment.

FIG. 10 is a block diagram of an exemplary computer system 1000. The computer system 1000 includes a processor 1005 that executes software instructions or code stored on a computer readable storage medium 1055 to perform the above-illustrated methods. The computer system 1000 includes a media reader 1040 to read the instructions from the computer readable storage medium 1055 and store the instructions in storage 1010 or in random access memory (RAM) 1015. The storage 1010 provides a large space for keeping static data where at least some instructions could be stored for later execution. The stored instructions may be further compiled to generate other representations of the instructions and dynamically stored in the RAM 1015. The processor 1005 reads instructions from the RAM 1015 and performs actions as instructed. According to one embodiment, the computer system 1000 further includes an output device 1025 (e.g., a display) to provide at least some of the results of the execution as output including, but not limited to, visual information to users and an input device 1030 to provide a user or another device with means for entering data and/or otherwise interact with the computer system 1000. Each of these output devices 1025 and input devices 1030 could be joined by one or more additional peripherals to further expand the capabilities of the computer system 1000. A network communicator 1035 may be provided to connect the computer system 1000 to a network 1050 and in turn to other devices connected to the network 1050 including other clients, servers, data stores, and interfaces, for instance. The modules of the computer system 1000 are interconnected via a bus 1045. Computer system 1000 includes a data source interface 1020 to access data source 1060. The data source 1060 can be accessed via one or more abstraction layers implemented in hardware or software. For example, the data source 1060 may be accessed by network 1050. In some embodiments the data source 1060 may be accessed via an abstraction layer, such as a semantic layer.

A data source is an information resource. Data sources include sources of data that enable data storage and retrieval. Data sources may include databases, such as relational, transactional, hierarchical, multi-dimensional (e.g., OLAP), object oriented databases, and the like. Further data sources include tabular data (e.g., spreadsheets, delimited text files), data tagged with a markup language (e.g., XML data), transactional data, unstructured data (e.g., text files, screen scrapings), hierarchical data (e.g., data in a file system, XML data), files, a plurality of reports, and any other data source accessible through an established protocol, such as Open Data Base Connectivity (ODBC), produced by an underlying software system (e.g., ERP system), and the like. Data sources may also include a data source where the data is not tangibly stored or otherwise ephemeral such as data streams, broadcast data, and the like. These data sources can include associated data foundations, semantic layers, management systems, security systems and so on.

In the above description, numerous specific details are set forth to provide a thorough understanding of embodiments. One skilled in the relevant art will recognize, however that the embodiments can be practiced without one or more of the specific details or with other methods, components, techniques, etc. In other instances, well-known operations or structures are not shown or described in detail.

Although the processes illustrated and described herein include series of steps, it will be appreciated that the different embodiments are not limited by the illustrated ordering of steps, as some steps may occur in different orders, some concurrently with other steps apart from that shown and described herein. In addition, not all illustrated steps may be required to implement a methodology in accordance with the one or more embodiments. Moreover, it will be appreciated that the processes may be implemented in association with the apparatus and systems illustrated and described herein as well as in association with other systems not illustrated.

The above descriptions and illustrations of embodiments, including what is described in the Abstract, is not intended to be exhaustive or to limit the one or more embodiments to the precise forms disclosed. While specific embodiments of, and examples for, the one or more embodiments are described herein for illustrative purposes, various equivalent modifications are possible within the scope, as those skilled in the relevant art will recognize. These modifications can be made in light of the above detailed description. Rather, the scope is to be determined by the following claims, which are to be interpreted in accordance with established doctrines of claim construction.

What is claimed is:

1. A non-transitory computer-readable medium to store instructions, which when executed by a computer, cause the computer to perform operations comprising:
   selecting, from an integration flow already displayed in a web editor of a graphical user interface, a segment of the integration flow by receiving an identification of a start point and an identification of an end point in the integration flow, wherein the integration flow includes integration components connected in a sequence, and each connection between the integration components represents a sequence flow;
   providing a test payload at the web editor, wherein the test payload is input for the integration testing; and
   based on the start point, the end point, and the test payload, simulating integration testing for the segment of the integration flow, the integration testing comprising:
      generating a code segment corresponding to the segment of the integration flow between the start point and the end point specified in the web editor;
      generating a runtime artifact based on the code segment;
      executing the runtime artifact with the test payload in a worker node hosting an integration runtime engine;
      receiving a result of the simulated integration testing, including a payload output corresponding to each sequence flow in the integration flow; and
      displaying, in the web editor, the result at a visual proximity to the sequence flows in the segment of the integration.

2. The computer-readable medium of claim 1, further comprises instructions which when executed by the computer further cause the computer to:
   load the runtime artifact in a volatile memory corresponding to the worker node;
   execute the runtime artifact with the test payload;
   send the result of the simulated integration testing to the web editor; and
   unload the runtime artifact from the volatile memory.

3. The computer-readable medium of claim 1, further comprises instructions which when executed by the computer further cause the computer to:
   based on a selection of a sequence flow, display a payload corresponding to the sequence flow in a web editor in the graphical user interface.

4. The computer-readable medium of claim 1, further comprises instructions which when executed by the computer further cause the computer to:
   placing a start point icon at a visual proximity to a first integration component from where the simulated integration testing is to be performed;
   placing an end point icon at a visual proximity to a second integration component until where the simulated integration testing is to be performed; and
   identify a segment of integration flow between the start point icon and the end point icon as the segment of the integration flow.

5. The computer-readable medium of claim 1, wherein the integration flow includes integration components connected in a sequence, and the connection between the integration components represents sequence flows.

6. The computer-readable medium of claim 1, wherein the integration flow corresponds to a use case.

7. The computer-readable medium of claim 1, further comprises instructions which when executed by the computer further cause the computer to, after generating the runtime artifact based on the code segment:
   deploy the runtime artifact in a worker node hosting an integration runtime engine; and
   load the runtime artifact in a volatile memory corresponding to the worker node before executing the runtime engine artifact with the test payload in the worker node.

8. A computer-implemented method of simulation of cloud platform integration testing in a visual interface, the method comprising:
   selecting, from an integration flow already displayed in a web editor of a graphical user interface, a segment of the integration flow by receiving an identification of a start point and an identification of an end point in the integration flow, wherein the integration flow includes integration components connected in a sequence, and each connection between the integration components represents a sequence flow;
   providing a test payload in the web editor, wherein the test payload is input for the integration testing; and
   based on the start point, the end point, and the test payload, simulating integration testing for the segment of the integration flow, the integration testing comprising:
      generating a code segment corresponding to the segment of the integration flow between the start point and the end point specified in the web editor;
      generating a runtime artifact based on the code segment;
      executing the runtime artifact with the test payload in a worker node hosting an integration runtime engine;
      receiving a result of the simulated integration testing, including a payload output corresponding to each sequence flow in the integration flow; and
      displaying, in the web editor, the result of the simulated integration testing at a visual proximity to the sequence flows in the segment of the integration flow.

9. The method of claim 8, further comprising:
   load the runtime artifact in a volatile memory corresponding to the worker node;
   execute the runtime artifact with the test payload;
   send the result of the simulated integration testing to the web editor; and
   unload the runtime artifact from the volatile memory.

10. The method of claim 8, further comprising:
    based on a selection of a sequence flow, display a payload corresponding to the sequence flow in a web editor in the graphical user interface.

11. The method of claim 8, further comprising:
    placing a start point icon at a visual proximity to a first integration component from where the simulated integration testing is to be performed;
    placing an end point icon at a visual proximity to a second integration component until where the simulated integration testing is to be performed; and
    identify a segment of integration flow between the start point icon and the end point icon as the segment of the integration flow.

12. The method of claim 8, wherein the integration flow includes integration components connected in a sequence, and the connection between the integration components represents sequence flows.

13. The method of claim 8, wherein the integration flow corresponds to a use case.

14. A computer system for cloud platform integration testing in a graphical user interface, comprising:
a computer memory to store program code; and
a processor to execute the program code to:
select, from an integration flow already displayed in a web editor of a graphical user interface, a segment of the integration flow by receiving an identification of a start point and an identification of an end point in the integration flow, wherein the integration flow includes integration components connected in a sequence, and each connection between the integration components represents a sequence flow;
provide a test payload in the web editor, wherein the test payload is input for the integration testing; and
based on the start point, the end point, and the test payload, simulate integration testing for the segment of the integration flow, the integration testing comprising:
generating a code segment corresponding to the segment of the integration flow between the start point and the end point specified in the web editor;
generating a runtime artifact based on the code segment;
executing the runtime artifact with the test payload in a worker node hosting an integration runtime engine;
receiving a result of the simulated integration testing, including a payload output corresponding to each sequence flow in the integration flow; and
displaying, in the web editor, the result of the simulated integration testing at a visual proximity to the sequence flows in the segment of the integration flow.

15. The system of claim 14, wherein the processor further executes the program code to:
load the runtime artifact in a volatile memory corresponding to the worker node;
execute the runtime artifact with the test payload;
send the result of the simulated integration testing to the web editor; and
unload the runtime artifact from the volatile memory.

16. The system of claim 14, wherein the processor further executes the program code to:
based on a selection of a sequence flow, display a payload corresponding to the sequence flow in a web editor in the graphical user interface.

17. The system of claim 14, wherein the processor further executes the program code to:
placing a start point icon at a visual proximity to a first integration component from where the simulated integration testing is to be performed;
placing an end point icon at a visual proximity to a second integration component until where the simulated integration testing is to be performed; and
identify a segment of integration flow between the start point icon and the end point icon as the segment of the integration flow.

18. The system of claim 14, wherein the integration flow includes integration components connected in a sequence, and the connection between the integration components represents sequence flows.

* * * * *